United States Patent
Yi et al.

(10) Patent No.: US 11,003,738 B2
(45) Date of Patent: May 11, 2021

(54) DYNAMICALLY NON-GAUSSIAN ANOMALY IDENTIFICATION METHOD FOR STRUCTURAL MONITORING DATA

(71) Applicant: Dalian University of Technology, Dalian (CN)

(72) Inventors: Tinghua Yi, Dalian (CN); Haibin Huang, Dalian (CN); Hongnan Li, Dalian (CN)

(73) Assignee: DALIAN UNIVERSITY OF TECHNOLOGY, Dalian (CN)

(*) Notice: Subject to any disclaimer, the term of this patent is extended or adjusted under 35 U.S.C. 154(b) by 266 days.

(21) Appl. No.: 16/090,911

(22) PCT Filed: Feb. 12, 2018

(86) PCT No.: PCT/CN2018/076577
§ 371 (c)(1),
(2) Date: Oct. 3, 2018

(87) PCT Pub. No.: WO2018/149387
PCT Pub. Date: Aug. 23, 2018

(65) Prior Publication Data
US 2019/0121838 A1    Apr. 25, 2019

(30) Foreign Application Priority Data
Feb. 16, 2017 (CN) .......................... 201710084131.6

(51) Int. Cl.
*G06F 17/18* (2006.01)
*G06K 9/00* (2006.01)
(Continued)

(52) U.S. Cl.
CPC ............. *G06F 17/18* (2013.01); *G06F 30/20* (2020.01); *G06K 9/00* (2013.01); *G01M 5/0008* (2013.01)

(58) Field of Classification Search
CPC .......... G06F 17/18; G06F 30/20; G06K 9/00; G06K 9/00536; G06K 9/6247;
(Continued)

(56) References Cited

U.S. PATENT DOCUMENTS 6,892,163 B1 * 5/2005 Herzog ............... G06K 9/6278
700/30
9,843,596 B1 * 12/2017 Averbuch ............. G06F 21/552
(Continued)

FOREIGN PATENT DOCUMENTS

CN    102323049 A    1/2012
CN    103116804 A    5/2013
(Continued)

*Primary Examiner* — Alessandro V Amari
*Assistant Examiner* — Christian T Bryant
(74) *Attorney, Agent, or Firm* — Muncy, Geissler, Olds & Lowe, P.C.

(57) ABSTRACT

The present invention belongs to the technical field of health monitoring for civil structures, and a dynamically non-Gaussian anomaly identification method is proposed for structural monitoring data. First, define past and current observation vectors for the monitoring data and pre-whiten them; second, establish a statistical correlation model for the whitened past and current observation vectors to obtain dynamically whitened data; then, divide the dynamically whitened data into two parts, i.e., the system-related and system-unrelated parts, which are further modelled by the independent component analysis; finally, define two statistics and determine their corresponding control limits, respectively, it can be decided that there is anomaly in the monitoring data when each of the statistics exceeds its corresponding control limit. The non-Gaussian and dynamic characteristics of structural monitoring data are simultaneously taken into account, based on that the defined statistics can effectively identify anomalies in the data.

1 Claim, 1 Drawing Sheet

(51) Int. Cl.
 *G06F 30/20* (2020.01)
 *G01M 5/00* (2006.01)
(58) Field of Classification Search
 CPC .............. G06K 9/6297; G01M 5/0008; H04L
 63/1416; H04L 63/1425; H04L 63/1441;
 G06N 7/005; G06N 20/00; G06N 99/005;
 G05B 23/024; G05B 23/0254
 See application file for complete search history.

(56) References Cited

U.S. PATENT DOCUMENTS

| | | | | |
|---|---|---|---|---|
| 2007/0179746 A1* | 8/2007 | Jiang | ..................... | G06F 11/008 |
| | | | | 702/185 |
| 2014/0108314 A1* | 4/2014 | Chen | ..................... | G06N 5/048 |
| | | | | 706/20 |
| 2014/0278303 A1* | 9/2014 | Larimore | ................ | G06F 30/20 |
| | | | | 703/2 |

FOREIGN PATENT DOCUMENTS

| | | | |
|---|---|---|---|
| CN | 103234753 | A | 8/2013 |
| CN | 106384300 | A | 2/2017 |
| CN | 106897509 | A | 6/2017 |

\* cited by examiner

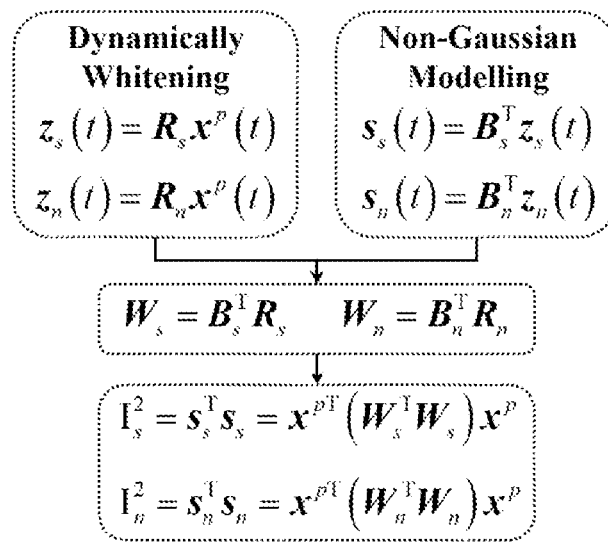

DYNAMICALLY NON-GAUSSIAN ANOMALY IDENTIFICATION METHOD FOR STRUCTURAL MONITORING DATA

TECHNICAL FIELD

The present invention belongs to the technical field of health monitoring for civil structures, and a dynamically non-Gaussian anomaly identification method is proposed for structural monitoring data.

BACKGROUND

The service performance of civil structures will inevitably deteriorate due to the collective effects of long-term loadings, environmental corrosion and fatigue factors. Through in-depth analysis of structural monitoring data, the abnormal condition of structures can be discovered in time and an accurate safety early-warning can then be provided, which has important practical significance for ensuring the safe operation of civil structures. At present, the anomaly identification of structural monitoring data is mainly achieved through statistical methods, which can be generally divided into two categories: 1) the univariate control chart, such as the Shewhart control chart, the CUSUM control chart and so forth, which is used to establish separate control chart for the monitoring data at each measurement point to identify anomalies in the monitoring data; and 2) the multivariate statistical analysis, such as the principal component analysis, the independent component analysis and so forth, which employs the correlation between monitoring data at multiple measurement points to establish a statistical model, and then defines corresponding statistics to identify anomalies in the monitoring data.

Due to the deformation continuity of structures, there exists correlation between structural response data at the adjacent measurement points. In practical engineering applications, multivariate statistical analysis is more advantageous since this kind of correlation can be considered. However, due to various factors, such as the structural nonlinearity, the complexity of measurement noise and so forth, structural monitoring data often exhibits non-Gaussian properties; in addition, dynamic characteristics (i.e., auto-correlation) also exist in structural monitoring data. If non-Gaussian and dynamic characteristics can be considered simultaneously in the modeling process of structural monitoring data, the anomaly identification ability of the multivariate statistical analysis method can be improved, making it more practical in engineering applications.

SUMMARY

The present invention aims to propose a dynamically non-Gaussian modeling method for structural monitoring data, based on that two statistics are defined to identify anomalies in the data. The technical solution of the present invention is as follows: first, define past and current observation vectors for the monitoring data and pre-whiten them; second, establish a statistical correlation model for the whitened past and current observation vectors to obtain dynamically whitened data; then, divide the dynamically whitened data into two parts, i.e., the system-related and system-unrelated parts, which are further modelled by the independent component analysis; finally, define two statistics and determine their corresponding control limits, respectively, it can be decided that there is anomaly in the monitoring data when each of the statistics exceeds its corresponding control limit.

A dynamically non-Gaussian anomaly identification method for structural monitoring data, the specific steps of which are as follows:

Step 1: Structural monitoring data preprocessing (1) Let $x(t)\in\Re^m$ represent a sample at time t in the normal structural monitoring data, where in is the number of measurement variables; define the past observation vector $x^p = [x^T(t-1), x^T(t-2), \ldots, x^T(t-\tau)]^T$ (note: $\tau$ is the time-lag) and the current observation vector $x^c(t) = x(t)$;

(2) Let $J^p$ and $J^c$ represent whitening matrices corresponding to $x^p(t)$ and $x^c(t)$, respectively, the whitened $x^p(t)$ and $x^c(t)$ can be obtained by $\tilde{x}^p(t) = J^p x^p(t)$ and $\tilde{x}^c(t) = J^c x^c(t)$, respectively;

Step 2: Dynamically whitening (3) Dynamically modeling of structural monitoring data is to establish a statistical correlation model between $\tilde{x}^p(t)$ and $\tilde{x}^c(t)$:

$$\tilde{S}_{pc} = E\{\tilde{x}^p \tilde{x}^{cT}\} = P\Sigma Q^T$$

where $\tilde{S}_{pc}$ represents the cross-covariance matrix of $\tilde{x}^p$ and $\tilde{x}^c$; $P\in\Re^{m\tau\times m\tau}$ and $Q\in\Re^{m\times m}$ represent matrices consisting all left and right singular vectors of singular value decomposition, respectively; $\Sigma\in\Re^{m\tau\times m}$ represents the singular value matrix, which contains in non-zero singular values;

(4) Define the projection of $\tilde{x}^p(t)$ on P, termed as $z(t)$, which can be calculated by the following equation:

$$z(t) = P^T \tilde{x}^p(t) = P^T J^p x^p(t) = R x^p(t)$$

where $R = P^T J^p$;

(5) Since the covariance matrix of $z(t)$ is an identity matrix:

$$S_{zz} = E\{zz^T\} = P^T E\{\tilde{x}^p \tilde{x}^{pT}\} P = I$$

and the above modeling process takes into account the dynamic characteristics of structural monitoring data, R can be termed as dynamically whitening matrix and $z(t)$ can be termed as dynamically whitened data;

Step 3: Dynamically non-Gaussian modelling (6) Divide the dynamically whitened data $z(t)$ into two parts using the following equations:

$$z_s(t) = R_s x^p(t)$$

$$z_n(t) = R_n x^p(t)$$

where $z_s(t)$ and $z_n(t)$ represent the system-related and system-unrelated parts of $z(t)$, respectively; $R_s$ and $R_n$ are consist of the first in rows and last $m(l-1)$ rows of R, respectively;

(7) Establish dynamically non-Gaussian models for $z_s(t)$ and $z_n(t)$ using independent component analysis:

$$s_s(t) = B_s^T z_s(t)$$

$$s_n(t) = B_n^T z_n(t)$$

where $s_s(t)$ and $s_n(t)$ represent system-related and system-unrelated independent components, respectively; $B_s$ and $B_n$ can be solved by the fast independent component analysis algorithm;

(8) Let $W_s = B_s^T R_s$ and $W_n = B_n^T R_n$, there exist the following equations:

$$s_s(t) = W_s x^p(t)$$

$$s_n(t) = W_n x^p(t)$$

where $W_s$ and $W_n$ represent de-mixing matrices corresponding to the system-related and system-unrelated parts, respectively;

Step 4: Define statistics and determine control limits (9) Define two statistics corresponding to $s_s(t)$ and $s_n(t)$, respectively:

$$I_s^2 = s_s^T s_s = x^{pT}(W_s^T W_s)x^p$$

$$I_n^2 = s_n^T s_n = x^{pT}(W_n^T W_n)x^p$$

(10) After calculating the statistics (i.e., $I_s^2$ and $I_n^2$) for all normal structural monitoring data, estimate the probability density distribution of $I_s^2$ and $I_n^2$, respectively; determine the control limits (i.e., $I_{s,lim}^2$ and $I_{n,lim}^2$) of the two statistics through the 99% confidence criterion; it can be decided that there exist anomalies in the newly acquired monitoring data, when each of the statistics exceeds its corresponding control limit.

The present invention has the beneficial effect that: the non-Gaussian and dynamic characteristics of structural monitoring data are simultaneously taken into account in the process of statistical modeling, based on that the defined statistics can effectively identify anomalies in the data.

BRIEF DESCRIPTION OF THE DRAWINGS

FIG. 1 is a schematic diagram for calculating anomaly identification statistics.

DETAILED DESCRIPTION

The following details is used to further describe the specific implementation process of the present invention.

Take a two-span highway bridge model, with a length of 5.4864 m and a width of 1.8288 m, as an example. A finite element model is built to simulate structural responses, and the responses at 12 finite element nodes are acquired as monitoring data. There are two datasets generated: the training dataset and the testing dataset; the training dataset consists of normal monitoring data, and part of the testing dataset is used to simulate abnormal monitoring data; both datasets last for 80 s and the sampling frequency is 256 Hz. The basic idea of the present invention is shown in FIG. 1.

(1) Construct the past observation vector $x^p(t)$ and the current observation vector $x^c(t)$ for each data point in the training dataset; then pre-whiten all past and current observation vectors (i.e., $x^p(t)$ and $x^c(t)$) to obtain the whitening matrices (i.e., $J^p$ and $J^c$) and the whitened past and current observation vectors (i.e., $\tilde{x}^p(t)$ and $\tilde{x}^c(t)$).

(2) Establish a statistical correlation model for $\tilde{x}^p(t)$ and $\tilde{x}^c(t)$ to obtain the dynamically whitening matrix R; the first 12 rows of R are used to construct $R_s$ and the others are used to construct $R_n$; calculate $z_s(t)=R_s x^p(t)$ and $z_n(t)=R_n x^p(t)$.

(3) Establish independent component analysis models for $z_s(t)$ and $z_n(t)$ to obtain matrices $B_s$ and $B_n$; correspondingly, the de-mixing matrices can be obtained through $W_s=B_s^T R_s$ and $W_n=B_n^T R_n$; calculate statistics $I_s^2$ and $I_n^2$, then determine their corresponding control limits $I_{s,lim}^2$ and $I_{n,lim}^2$; it can be decided that there exist anomalies in the data when each of the statistics exceeds its corresponding control limit.

(4) Simulate abnormal monitoring data in the testing dataset, that is, the monitoring data of sensor 2 gains anomaly during time 40~80 s; identify anomalies in the monitoring data using the two proposed statistics $I_s^2$ and $I_n^2$, results show that both $I_s^2$ and $I_n^2$ can successfully identify anomalies in the monitoring data.

The invention claimed is:

1. A dynamically non-Gaussian anomaly identification method for structural monitoring data by using a finite element model built for two-span highway bridge model to simulate structural responses, wherein responses at finite element nodes are acquired as monitoring data; there are two datasets generated including a training dataset and a testing dataset; the training dataset consisting of normal monitoring data, and part of the testing dataset being used to simulate abnormal monitoring data; the method comprising:

(1) defining $x(t) \in \Re^m$ that represents a sample at time t in the normal structural monitoring data, where m is the number of measurement variables; define a past observation vector $x^p(t)=[x^T(t-1), x^T(t-2), \ldots, x^T(t-\tau)]^T$ (note: $\tau$ is time-lag) and a current observation vector $x^c(t)=x(t)$;

(2) defining $J^p$ and $J^c$ that represents whitening matrices corresponding to $x^p(t)$ and $x^c(t)$, respectively, the whitened $x^p(t)$ and $x^c(t)$ is obtained by $\tilde{x}^p(t)=J^p x^p(t)$ and $\tilde{x}^c(t)=J^c x^c(t)$, respectively;

(3) dynamically modeling of structural monitoring data to establish a statistical correlation model between $\tilde{x}^p(t)$ and $\tilde{x}^c(t)$:

$$\tilde{S}_{pc} = E\{\tilde{x}^p \tilde{x}^{cT}\} = P \Sigma Q^T$$

where $\tilde{S}_{pc}$ represents a cross-covariance matrix of $\tilde{x}^p$ and $\tilde{x}^c$; $P \in \Re^{m\tau \times m\tau}$ and $Q \in \Re^{m \times m}$ represent matrices consisting all left and right singular vectors of singular value decomposition, respectively; $\Sigma \in \Re^{m\tau \times m\tau}$ represents a singular value matrix, which contains m non-zero singular values;

(4) defining a projection of $\tilde{x}^p(t)$ on P, termed as z(t), which is calculated by the following equation:

$$z(t) = P^T \tilde{x}^p(t) = P^T J^p x^p(t) = R x^p(t)$$

where $R = P^T J^p$;

(5) since a covariance matrix of z(t) is an identity matrix:

$$S_{zz} = E\{zz^T\} = P^T E\{\tilde{x}^p \tilde{x}^{pT}\} P = I$$

and the above modeling process takes into account dynamic characteristics of structural monitoring data, R is termed as dynamically whitening matrix and z(t) is termed as dynamically whitened data;

(6) dividing the dynamically whitened data z(t) into two parts using the following equations:

$$z_s(t) = R_s x^p(t)$$

$$z_n(t) = R_n x^p(t)$$

where $z_s(t)$ and $z_n(t)$ represent the system-related and system-unrelated parts of z(t), respectively; $R_s$ and $R_n$ consist of the first m rows and last m(i−1) rows of R, respectively;

(7) establishing dynamically non-Gaussian models for $z_s(t)$ and $z_n(t)$ using independent component analysis:

$$s_s = B_s^T z_s(t)$$

$$s_n(t) = B_n^T z_n(t)$$

where $s_s(t)$ and $s_n(t)$ represent system-related and system-unrelated independent components, respectively; $B_s$ and $B_n$ are solved by a fast independent component analysis algorithm;

(8) let $W_s=B_s^T R_s$ and $W_n=B_n^T R_n$, there exist the following equations:

$$s_s(t) = W_s x^p(t)$$

$$s_n(t) = W_n x^p(t)$$

where $W_s$ and $W_n$ represent de-mixing matrices corresponding to the system-related and system-unrelated parts, respectively;

(9) defining two statistics corresponding to $s_s(t)$ and $s_n(t)$, respectively:

$$I_s^2 = s_s^T s_s = x^{pT}(W_s^T W_s)x^p$$

$$I_n^2 = s_n^T s_n = x^{pT}(W_n^T W_n)x^p$$

(10) after calculating the statistics $I_s^2$ and $I_n^2$ for all normal structural monitoring data, estimating a probability density distribution of $I_s^2$ and $I_n^2$, respectively; determining control limits $I_{s,lim}^2$ and $I_{n,lim}^2$ of the two statistics through a 99% confidence criterion; and based on the determination of the control limits $I_{s,lim}^2$ and $I_{n,lim}^2$, determining whether there exist structural anomalies in a two-span highway bridge based on newly acquired monitoring data, when each of the statistics exceeds its corresponding control limit; and

(11) simulating abnormal monitoring data in the testing dataset based on the anomalies in the monitoring data.

\* \* \* \* \*